(12) United States Patent
Van De Rijdt et al.

(10) Patent No.: US 6,742,244 B2
(45) Date of Patent: Jun. 1, 2004

(54) DEVICE FOR PLACING COMPONENTS ON A CARRIER

(75) Inventors: Johannes Hubertus Antonius Van De Rijdt, Eindhoven (NL); Olav Johannes Seijger, Eindhoven (NL); Leonardus Cornelis Maria Sanders, Eindhoven (NL); Hermanus Mathias Joannes Rene Soemers, Eindhoven (NL)

(73) Assignee: Konirklijke Philips Electronics N.V., Eindhoven (NL)

( * ) Notice: Subject to any disclaimer, the term of this patent is extended or adjusted under 35 U.S.C. 154(b) by 189 days.

(21) Appl. No.: 09/954,647

(22) Filed: Sep. 18, 2001

(65) Prior Publication Data

US 2002/0088107 A1 Jul. 11, 2002

(30) Foreign Application Priority Data

Sep. 13, 2000 (EP) .............................. 00203178

(51) Int. Cl.⁷ ................................................ B23P 19/00
(52) U.S. Cl. ............................ 29/743; 29/740; 29/741; 29/DIG. 44; 29/832; 294/64.1; 294/2
(58) Field of Search .......................... 29/743, 741, 740, 29/721, 832, DIG. 44; 294/64.1; 414/752.1; 901/40; 228/180.22, 6.2, 222

(56) References Cited

U.S. PATENT DOCUMENTS 5,285,946 A * 2/1994 Tomigashi et al. ............. 228/9
5,447,266 A    9/1995 Misono ....................... 228/102
5,644,279 A    7/1997 Piper et al. .................. 335/228
5,657,533 A *  8/1997 Fukui et al. .................. 29/740
6,343,415 B1 * 2/2002 Okuda et al. ................. 29/743
6,471,110 B1 * 10/2002 Luechinger et al. ......... 228/102
2002/0088107 A1 * 7/2002 Van De Rijdt et al. ..... 29/592.1

FOREIGN PATENT DOCUMENTS

| DE | 3938088 | | 5/1991 | .......... H05K/13/02 |
| JP | 1-179330 | * | 7/1989 | |
| JP | 11112196 A | | 4/1999 | .......... H05K/13/04 |
| JP | 11145683 A | | 5/1999 | .......... H05K/13/04 |

* cited by examiner

*Primary Examiner*—Peter Vo
*Assistant Examiner*—Minh Trinh
(74) *Attorney, Agent, or Firm*—Aaron Waxler

(57) ABSTRACT

The invention relates to a device for mounting components on a carrier comprising a frame (25) in which a shaft (8) is accommodated, the shaft is provided with a longitudinal bore (16), and means for displacing said hollow shaft (8) in vertical direction through said frame (25), wherein said shaft (8) at one end (8a) facing away from the carrier can be coupled to means (17) for generating an under pressure or vacuum within said bore (16) and wherein the other end (8b) of the shaft facing towards the carrier is provided with means for picking up and mounting a component. According to the invention, the device is characterized in that said shaft (8) is coupled to a yoke (12) which forms part of said displacement means, which coupling can be temporarily disengaged the moment the shaft makes contact with a component or a carrier.

11 Claims, 2 Drawing Sheets

DEVICE FOR PLACING COMPONENTS ON A CARRIER

BACKGROUND OF THE INVENTION

The invention relates to a device for placing components on a carrier, such as a printed circuit board, comprising a frame with a vertically positioned shaft accommodated therein, which shaft is provided with a bore along its centerline, and displacement means for displacing the hollow shaft in vertical direction in the frame, which shaft can be coupled at its end facing away from the carrier to means capable of generating an underpressure or vacuum in the bore, while the end of the shaft facing towards the carrier is suitable for picking up and placing a component by means of the underpressure or vacuum.

Such a device is known from DE-39 38 088 A1. A disadvantage of such a device is the control of the impact force, i.e. the force exerted by the shaft on the component at the moment the latter comes into contact with the printed circuit board. To obtain a lead time through the device of the printed circuit board under operation which is as short as possible, the shaft is displaced in vertical direction with comparatively high velocities by the displacement means. A timely deceleration of the shaft by the displacement means is desirable in this connection for keeping the impact force as low as possible. A low mass of the moving parts is desirable here so as to be able to realize the desired high velocities and the accompanying accelerations.

However, the control of a low impact force is limited by the mass of the moving parts and the "reaction speed" of the control in decelerating the displacement means the moment a contact with the printed circuit board is detected.

SUMMARY OF THE INVENTION

The invention has for its object to counteract the above disadvantages and to provide a device with which a very small impact force can be achieved. The device according to the invention is for this purpose characterized in that the shaft is coupled to a yoke which forms part of the displacement means, which coupling can be disengaged temporarily the moment the shaft comes into contact with a component or a carrier. A temporary disengagement at the moment of contact interrupts the vertical drive of the shaft and thus results in a very small impact force. In addition, the displacement means can also be decelerated in time owing to this temporary disengagement.

In an embodiment of the device according to the invention, the displacement means comprise a coil which is fixedly arranged in the frame, within which coil a magnet core is accommodated which is displaceable in vertical direction. The displaceable magnet core may form part of the yoke here. Since the coils of the displacement means are fixedly accommodated in the frame, a further reduction in the mass to be displaced is obtained. An additional advantage is that all connection cables for controlling the displacement means are also fixedly connected in the frame, which will considerably prolong the useful life of these cables, especially since they do not move in the frame now.

A special embodiment of a device according to the invention, in which in addition the shaft is provided with a first magnet at its end facing away from the carrier, which first magnet lays the shaft against a first abutment in the idle and in the operational position by means of a second magnet provided on the yoke, is characterized according to the invention in that the shaft is rotatably accommodated in the yoke by means of a bearing, which bearing has an axial clearance such that during operation the displacement means traverse a clearing distance from the first abutment to a second abutment in vertical direction when the shaft comes into contact with a component or a carrier. While traversing the axial clearance, the shaft is in idleness, and the control can decelerate the displacement means in time. This construction has the additional advantage that the displacement means, at the moment when they bear on the second abutment, are capable of exerting a highly controlled force on the shaft for the purpose of pressing the component into the printed circuit board.

It should be noted that U.S. Pat. No. 5,644,279 shows a placement device in which the shaft is forced against a first abutment in one direction by magnetic force. A second abutment, however, is absent here, so that the component after being placed cannot be pressed home with a defined force.

According to the invention, the second abutment is formed by a stud provided on the shaft. According to the invention, furthermore, the device may be characterized in that the displacement means are provided with reading means for reading the vertical displacement of the shaft in the frame during operation.

In a more particular embodiment of the device, the latter is characterized in that the vacuum means comprise an elongate, fixedly positioned tube which extends over a certain length from the end of the shaft facing away from the carrier into the bore. It is possible here that at least one seal is provided between the tube and the bore. As was noted above, this construction has the advantage that the vacuum means can be fixedly accommodated in the frame and need not be displaced along with the shaft in vertical direction. Here, again, only a small mass need be displaced in vertical direction through the frame.

The invention also relates to a device as described above which is in addition provided with rotation means for rotating the shaft about its centerline. According to the invention, this embodiment of the device is characterized in that the shaft is held in a housing by means of a linear ball bearing guide, said housing being rotatably accommodated in the frame. It is possible here that the housing is provided with a gearing over which a continuous transmission element, which can be driven by a motor, is provided.

The use of a linear ball bearing guide leads to a further reduction of the mass to be displaced in vertical direction.

To obtain a more accurate reading of the degree of rotation of the housing and of the shaft, according to the invention, the housing is provided with reading means for reading the rotation of the shaft during operation. In an embodiment, said reading means may comprise an encoder disc situated around the shaft.

BRIEF DESCRIPTION OF THE DRAWINGS

The invention will now be explained with reference to a drawing and an embodiment of a device according to the invention.

DESCRIPTION OF THE INVENTION

Figure 1:
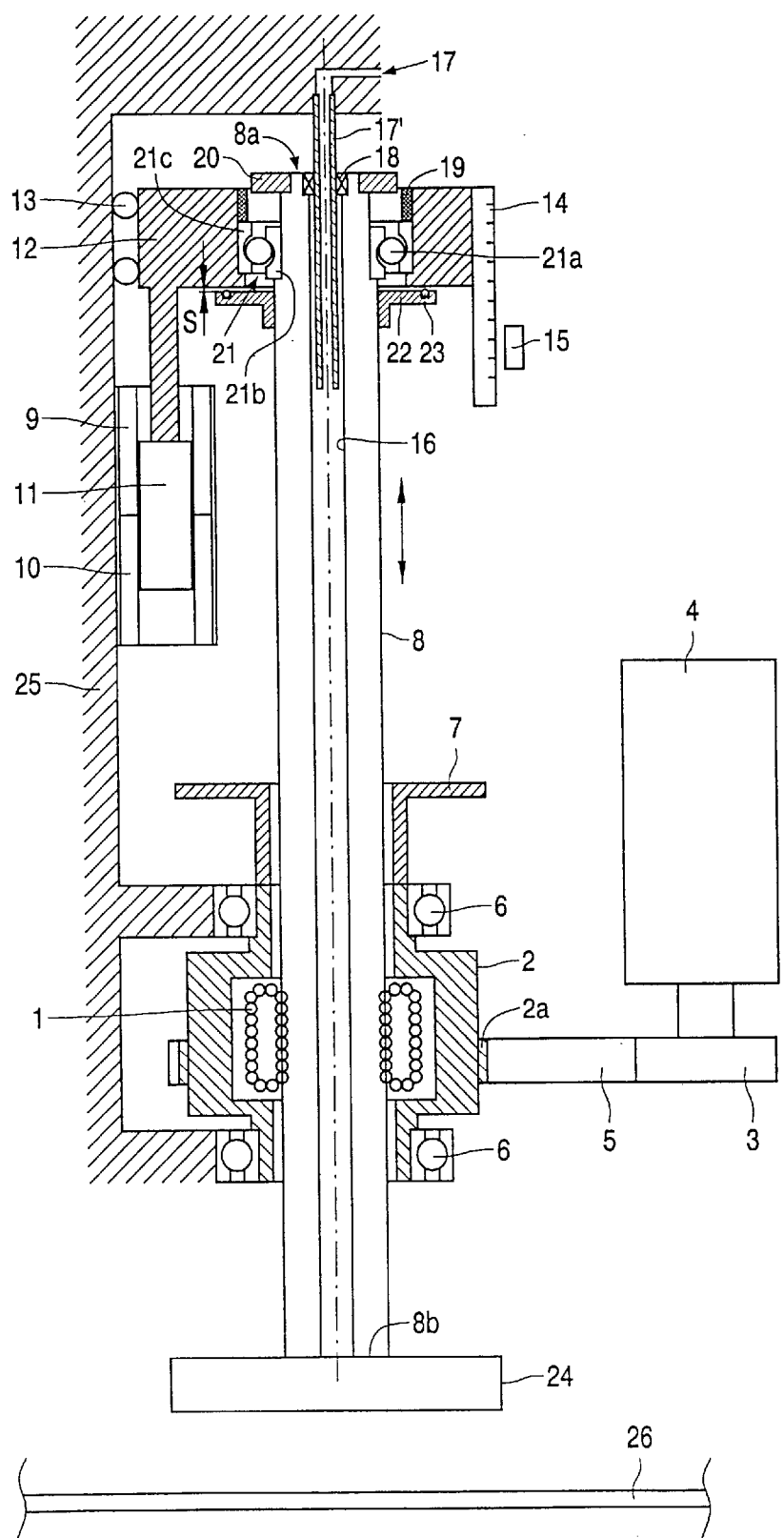
FIG. 1 shows a placement device in a situation before the disengagement of the shaft.

FIG. 1 shows a frame 25 in which a shaft 8 is accommodated. The shaft 8 is reciprocally displaceable in vertical direction by displacement means which comprise inter alia one or several coils 9, 10. The coils are fixedly incorporated in the frame here. A magnet core 11 is arranged between the coils 9 and 10, which core can be displaced up and down by means of a control signal traversing the coils 9, 10. The magnet core 11 is connected to a yoke 12, which yoke 12 is held in the frame 25 by means of a guide 13. A ruler 14 is also fastened to this yoke, so that the vertical displacement of the yoke 12 and the shaft 8 in the frame 25 can be read by means of a reading head 15 of a linear measuring system (not shown).

The shaft 8 is suitable for picking up and placing components 24, for example electrical or electronic components, on a carrier 26 which may be, for example, a printed circuit board. A known method for this is the use of an underpressure or vacuum by means of which the relevant components can be taken up and put down. The shaft 8 is for this purpose provided with a longitudinal bore 16, and the shaft 8 is coupled at its end 8a facing away from the carrier 26 to means 17 capable of generating an underpressure or vacuum in the bore 16. The coupling between said means 17 and the hollow shaft 8 is formed by a tube 17' which extends into the bore 16 over a certain distance. A seal 18 is provided between the tube 18 and the bore 16 so as to obtain a good airtight closure between the tube 17' fixedly arranged in the frame and the shaft 8 during the vertical reciprocal movement of the shaft 8 in the frame 25.

The shaft 8 may optionally be mounted with rotation possibility in the frame 25, also for obtaining an additional orientation freedom for the placement of a component on a carrier. According to the invention, the shaft 8 extends into a housing 2 which is rotatably accommodated in the frame 25 by means of bearings 6. The housing 2 is provided with teeth 2a over which a toothed, continuous transmission element 5, such as a toothed belt, is guided. A rotary movement may be forced on the housing 2 by means of this toothed belt 5 which also runs over a pinion 3 driven by a motor 4.

The housing 2 is provided with an encoder disc 7 for a correct reading of the degree of rotation of the shaft 8. This method of reading is more accurate than reading of the rotation at the motor side 4.

A linear ball bearing guide or ball spline 1 renders possible a displacement in vertical direction of the shaft through the housing 2, while at the same time ensuring a joint rotation of the shaft 8 and the housing 2 about the centerline of the shaft 8.

A problem in the known devices is the control of the contact or impact force of the shaft 8 the moment it makes contact by its end 8b with a component 24 and/or a carrier 26. To keep this impact force as small as possible, so as to prevent damage to the device, but most of all to the components and the carrier, the mass of the yoke 12 and the magnet core 11 coupled thereto is temporarily disengaged from the shaft 8 during the impact process the moment the shaft 8 comes into contact with a component or a carrier. For this purpose the shaft 8 is rotatably accommodated in the yoke 12 by means of a bearing 21, which bearing is further provided with a linear or axial clearance. In the embodiment shown, the bearing is an axial bearing 21 whose balls 21a are accommodated with clearance in the ball races 21b and 21c. The ball race 21b is fastened to the shaft 8 and the ball race 21c to the yoke 12. During operation, the shaft 8 bears on a first abutment of the axial bearing 21 in this bearing. In this situation, the balls 21a are enclosed between an upper portion of the ball race 21b and a lower portion of the ball race 21c, as is apparent from FIG. 1. The first abutment is safeguarded by the magnetic attraction between a magnet 19 placed on the yoke 12 and an iron ring 20 provided on the end 8a of the shaft 8. This magnetic attraction pulls the shaft 8 in downward direction relative to the yoke 12, so that the shaft 8 rests on the bearing at one side. The magnetic force is so great that this situation remains intact in the case of a maximum acceleration of the yoke.

Figure 2:
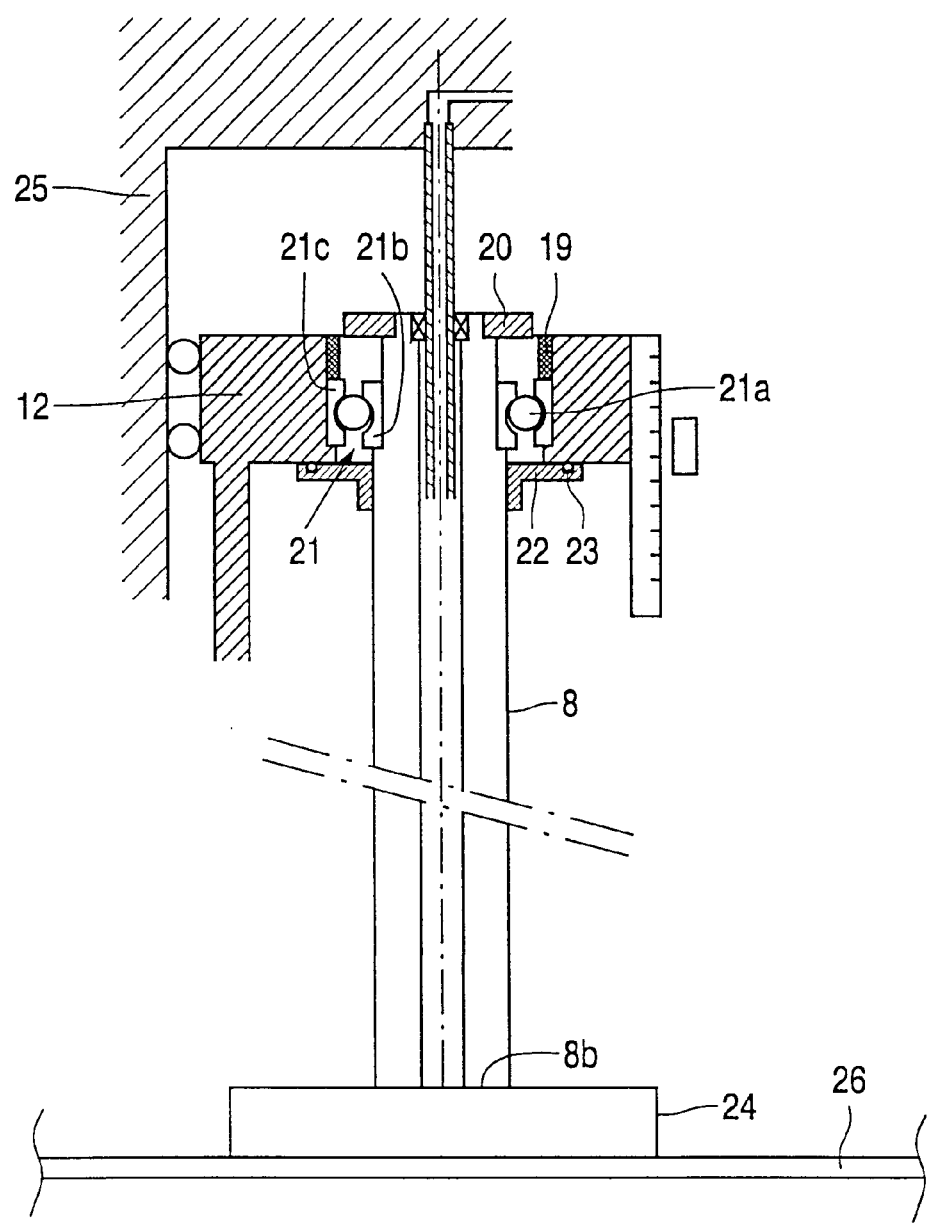
FIG. 2 shows part of the placement device of FIG. 1 in a situation in which the shaft has been disengaged.

The moment the end 8b of the shaft 8 comes into contact with a component 24 or a carrier 26, the shaft 8 is hampered in its vertical displacement. To keep the impact force of the shaft on the component or carrier as small as possible, so as to prevent any resulting damage or an overrun of the shaft, the magnetic coupling between the shaft 8 and the yoke 12 is broken at the moment of contact. After the magnetic decoupling, it is only the yoke 12 and the magnet core 11 which are displaced in vertical direction by the displacement means 9, 10, traversing a clearance indicated with the letter S in FIG. 1 from the first abutment up to a second abutment. After the clearance S has been traversed, the yoke 12 comes into contact with the second abutment which consists of a stud 22 provided on the shaft 8. The provision of the clearance S is possible thanks to the clearance in the bearing 21. This situation is shown in FIG. 2.

The stud 22 may be provided with an impact ring 23. While the clearance S is being traversed, the shaft 8 is disengaged from the displacement means and accordingly does not perform a vertical displacement in the frame 25, instead, it rests on the component or the carrier. The moment at which the end 8b of the shaft 8 makes contact with a component 24 or a carrier 26 can be detected by suitable means and is a sign for the control to decelerate the displacement means 9, 10, 11. The yoke 12 comes to a standstill against the abutment 22 exactly at the moment it has traversed the clearance distance S.

At that moment the displacement means can be energized again, for example for displacing the yoke 12 and the shaft 8 in the opposite vertical direction, or for controlling the displacement means such that the correct compression force is built up for placing the component on the printed circuit board.

It will be obvious that the temporary disengagement of the shaft 8 from the displacement means renders it possible to decelerate the latter at the correct moment, thanks to the clearance distance S being traversed, so that after traversing of the clearance the component can be pressed home onto a printed circuit board with the correct compression force. Damage is prevented thereby, as is an overrun of the shaft 8 through the printed circuit board.

It is obvious that alternative types of bearings 21 having an axial clearance are also possible.

The embodiment described above has the additional advantage that a small mass is moved up and down in vertical direction in the frame 25. This mass is formed only by the shaft 8, the yoke 12, and the magnet core 11. The displacement means 9, 10, the vacuum means 17, and the rotation means 2, 3, 4, 5 are fixedly accommodated in the frame 25, as seen in vertical direction. The shaft 8 moves in vertical direction through the housing 2 by means of the linear ball bearing guide 1.

This also has the advantage that all connection cables for controlling the various drive means are also fixedly, i.e. not movably held in the frame 25. This considerably prolongs the operational life of the connection cables.

What is claimed is:
1. A device for placing components on a carrier, comprising a frame (25) with a vertically positioned shaft (8) accommodated therein, the shaft is provided with a bore (16) along its centerline, and displacement means (9, 10, 11) for displacing the hollow shaft (8) in vertical direction in the frame, the shaft (8) is capable of coupling at a first end (8a) facing away from the carrier to means (17) capable of generating an underpressure or vacuum in the bore (16), while a second end (8b) of the shaft facing towards the carrier is capable of picking up and placing at least one of the components by means of the underpressure or vacuum, characterized in that the shaft (8) is coupled to a yoke (12) which forms part of the displacement means, wherein said shaft and said yoke can be disengaged temporarily the moment the shaft comes into contact with the component or the carrier and in that the displacement means comprise a coil which is fixedly arranged in the frame, within the coil a magnet core is accommodated which is displaceable in vertical direction.

2. The device as claimed in claim 1, characterized in that the displaceable magnet core (11) forms part of the yoke (12).

3. The device as claimed in claim 1, in which the shaft (8) is provided with a first magnet (20) at the first end (8a) facing away from the carrier, which first magnet lays the shaft against a first abutment in the idle and in the operational position by means of a second magnet (19) provided on the yoke, characterized in that the shaft (8) is rotatably accommodated in the yoke (12) by means of a bearing (21), which bearing (21) has an axial clearance such that during operation the displacement means traverse a clearing distance from the first abutment to a second abutment in vertical direction when the shaft (8) comes into contact with the component or the carrier.

4. The device as claimed in claim 3, characterized in that the second abutment is formed by a stud (22) provided on the shaft (8).

5. The device as claimed in claim 1, characterized in that the displacement means are provided with reading means (14, 15) for reading the vertical displacement of the shaft (8) in the frame during operation.

6. The device as claimed in claim 1, characterized in that the vacuum means comprise an elongate, fixedly positioned tube (17') which extends over a certain length from the end (8a) of the shaft facing away from the carrier into the bore (16).

7. The device as claimed in claim 6, characterized in that at least one seal (18) is provided between the tube (17') and the bore (16).

8. The device as claimed in claim 1, also comprising rotation means (2, 3, 4, 5) for rotating the shaft (8) about its centerline, characterized in that the shaft (8) is held in a housing (2) by means of a linear ball bearing guide (1), said housing (2) being rotatably accommodated in the frame.

9. The device as claimed in claim 8, characterized in that the housing (2) is provided with a gearing over which a continuous transmission element (5), which can be driven by a motor (4), is provided.

10. The device as claimed in claim 8, characterized in that the housing (2) is provided with reading means (7) for reading the rotation of the shaft (8) during operation.

11. The device as claimed in claim 10, characterized in that said reading means comprise an encoder disc (7) situated around the shaft (8).

\* \* \* \* \*